(12) United States Patent
Loopstra et al.

(10) Patent No.: US 7,804,579 B2
(45) Date of Patent: Sep. 28, 2010

(54) CONTROL SYSTEM, LITHOGRAPHIC PROJECTION APPARATUS, METHOD OF CONTROLLING A SUPPORT STRUCTURE, AND A COMPUTER PROGRAM PRODUCT

(75) Inventors: Erik Roelof Loopstra, Heeze (NL); Engelbertus Antonlus Fransiscus Van Der Pasch, Oirschot (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 707 days.

(21) Appl. No.: 11/812,817

(22) Filed: Jun. 21, 2007

(65) Prior Publication Data

US 2008/0316460 A1 Dec. 25, 2008

(51) Int. Cl.
*G03B 27/42* (2006.01)
*G03B 27/58* (2006.01)
*G03B 27/32* (2006.01)
*G01B 11/00* (2006.01)
*G01B 11/14* (2006.01)

(52) U.S. Cl. .............................. 355/53; 355/72; 355/77; 356/399; 356/616

(58) Field of Classification Search .................. 355/53, 355/72, 77; 356/399, 400, 401, 614–623
See application file for complete search history.

(56) References Cited

U.S. PATENT DOCUMENTS

| | | | |
|---|---|---|---|
| 5,751,404 | A | 5/1998 | Murakami et al. |
| 2001/0028456 | A1* | 10/2001 | Nishi .......................... 356/400 |
| 2002/0001082 | A1 | 1/2002 | Akimoto et al. |
| 2002/0149754 | A1 | 10/2002 | Auer et al. |

(Continued)

FOREIGN PATENT DOCUMENTS

EP 1 126 323 A2 8/2001

(Continued)

OTHER PUBLICATIONS

English Translation of JP 2003-022948 (dated Jan. 24, 2003).*

(Continued)

*Primary Examiner*—Alan A Mathews
(74) *Attorney, Agent, or Firm*—Sterne, Kessler, Goldstein & Fox P.L.L.C.

(57) ABSTRACT

A control system is provided for controlling a support structure in a lithographic apparatus. The control system includes a first measurement system arranged to measure the position of a substrate supported by the support structure, the position being measured in a first coordinate system. The control system further includes a second measurement system for measuring the position of the support structure in a second coordinate system, the first measurement system having a presumed position in the second coordinate system. The control system further comprises a controller configured to control the position of the support structure based on measurements by the second measurement system, to convert the measured position of the substrate into a converted position of the support structure in the second coordinate system, to position the support structure based on the converted position, to receive a position error signal indicative of a difference between the presumed position and an actual position of the first measurement system in the second coordinate system, and to position the support structure in a manner dependent upon the position error signal.

26 Claims, 6 Drawing Sheets

U.S. PATENT DOCUMENTS

| | | | |
|---|---|---|---|
| 2004/0211921 A1 | 10/2004 | Castenmiller et al. | |
| 2004/0263846 A1 | 12/2004 | Kwan | |
| 2006/0227309 A1 | 10/2006 | Loopstra et al. | |
| 2007/0052976 A1* | 3/2007 | Pril et al. | 356/616 |

FOREIGN PATENT DOCUMENTS

| | | |
|---|---|---|
| JP | 2002-367878 A | 12/2002 |
| JP | 2003-22948 A | 1/2003 |
| JP | 2005-331542 A | 12/2005 |

OTHER PUBLICATIONS

Search Report and Written Opinion mailed Oct. 28, 2008 for European Application No. 08158686.9-2222, 9 pgs.

Loopstra et al., "Lithographic Projection Apparatus and Method for Controlling a Support Structure" U.S. Appl. No. 12/142,271, filed Jun. 19, 2008.

Swedish Search Report for Application No. SE 2008 01130 mailed May 6, 2008, 4 pgs.

Scháffel et al., "Integrated electro-dynamic multicoordinate drives", Proc. ASPE Annual Meeting, California, USA, 1996, 456-641.

* cited by examiner

CONTROL SYSTEM, LITHOGRAPHIC PROJECTION APPARATUS, METHOD OF CONTROLLING A SUPPORT STRUCTURE, AND A COMPUTER PROGRAM PRODUCT

BACKGROUND

The present invention relates to a control system for controlling a support structure in a lithographic apparatus, a lithographic projection apparatus, a method of controlling a support structure in a lithographic apparatus, and a computer program product.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

One of the most challenging requirements in micro-lithography for the production of integrated circuits as well as liquid crystal display panels is the positioning of structures with respect to each other. For example, sub-100 nm lithography demands substrate-positioning and mask-positioning stages with dynamic accuracy and matching between machines in the order of 1 nm in 6 degrees of freedom (DOF), at velocities up to 3 m/s.

A widely used approach to achieve such demanding positioning requirements is to sub-divide the stage positioning architecture into a coarse positioning module (e.g. an X-Y table or a gantry table), onto which is cascaded a fine positioning module. The coarse positioning module has a micrometer accuracy. The fine positioning module is responsible for correcting for the residual error of the coarse positioning module to the last few nanometers. The coarse positioning module covers a large working range, while the fine positioning module only needs to accommodate a very limited range of travel. Commonly used actuators for such nano-positioning include piezoelectric actuators or voice-coil type electromagnetic actuators. While positioning in the fine module is usually effected in 6 DOF, large-range motions are rarely required for more than 2 DOF, thus easing the design of the coarse module considerably.

The micrometer accuracy required for the coarse positioning can be readily achieved using relatively simple position sensors, such as optical or magnetic incremental encoders. These can be single-axis devices with measurement in one DOF, or more recently multiple (up to 3) DOF devices such as those described by Schäiffel et al "Integrated electro-dynamic multicoordinate drives", Proc. ASPE Annual Meeting, California, USA, 1996, p. 456-461. Similar encoders are also available commercially, e.g. position measurement system Type PP281R manufactured by Dr. J. Heidenhain GmbH.

Position measurement for mask and substrate tables at the end of the fine positioning module, on the other hand, has to be performed in 6 DOF to sub-nanometer resolution, with nanometer accuracy and stability. This is commonly achieved using multi-axis interferometers to measure displacements in all 6 DOF, with redundant axes for additional calibration functions (e.g. calibrations of interferometer mirror flatness on the substrate table).

As an alternative for interferometers it is known to use optical encoders, possibly in combination with interferometers. Such optical encoders are for instance disclosed in US 2004/0263846 A1, which document is hereby incorporated herein by reference. In US2006/0227309, optical encoders use a grid pattern on one or more grid plates to determine their position with respect to the grid pattern. The optical encoders are mounted on the substrate table, while the grid plate is mounted on a frame of the lithographic apparatus. Consequently, it is known where the substrate table is with respect to the grid plate.

With the continual desire to image ever smaller patterns to create devices with higher component densities, while keeping the number of patterns manufactured per unit time the same, or even increase that number, numerous tasks within the lithographic apparatus need to be performed faster. Consequently, accelerations and decelerations of the substrate table also increase, which may lead to vibrations. Due to the aforementioned vibrations, alignment becomes more difficult. Even though an alignment system and the grid plate may be coupled to the same frame within the lithographic apparatus, their relative position stability becomes insufficient to perform alignment of a substrate with respect to the substrate table at desired levels of accuracy.

SUMMARY

The invention provides a control system for controlling a support structure in a lithographic apparatus. The control system comprises a first measurement system, a second measurement system and a controller. The first measurement system is arranged to measure, in a first coordinate system, a position of an object supported by the support structure. The second measurement system is configured to measure the position of the support structure in a second coordinate system. The first measurement system has a presumed position in the second coordinate system. The controller is configured to:

control the position of the support structure based on measurements by the second measurement system, convert the measured position of the object into a converted position of the support structure in the second coordinate system, and position the support structure based on the converted position.

The controller is further configured to receive a position error signal indicative of a difference between the presumed position and an actual position of the first measurement system in the second coordinate system, and to position the support structure in a manner dependent upon the position error signal.

Additionally, in an exemplary embodiment, the invention provides a lithographic projection apparatus that comprises the aforementioned control system.

Additionally, in an exemplary embodiment, the invention provides a method of controlling a support structure in a lithographic apparatus comprising the steps of:

providing an object to a support structure arranged to support the object;

measuring the position of the object in a first coordinate system using a first measurement system;

measuring the position of the support structure in a second coordinate system, the first measurement system having a presumed position in the second coordinate system;

converting the measured position of the object into a converted position of the support structure in the second coordinate system;

performing a first positioning of the support structure in a manner dependent upon the measured position of the support structure, the converted position of the support structure, and a position error signal indicative of a difference between the presumed position and an actual position of the first measurement system in the second coordinate system.

Another exemplary embodiment of the invention provides a computer program product embodied in a machine-readable medium. The computer program product is encoded with instructions for performing, when executed by a processor, a method of controlling a support structure in a lithographic apparatus. The method comprises the steps of:

providing an object to a support structure arranged to support the object, measuring the position of the object in a first coordinate system with a first measurement system, measuring the position of the support structure in a second coordinate system, the first measurement system having a presumed position in the second coordinate system, converting the measured position of the object into a converted position of the support structure in the second coordinate system, and performing a first positioning of the support structure in a manner dependent upon the measured position of the support structure, the converted position of the support structure, and a position error signal indicative of a difference between the presumed position and an actual position of the first measurement system in the second coordinate system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
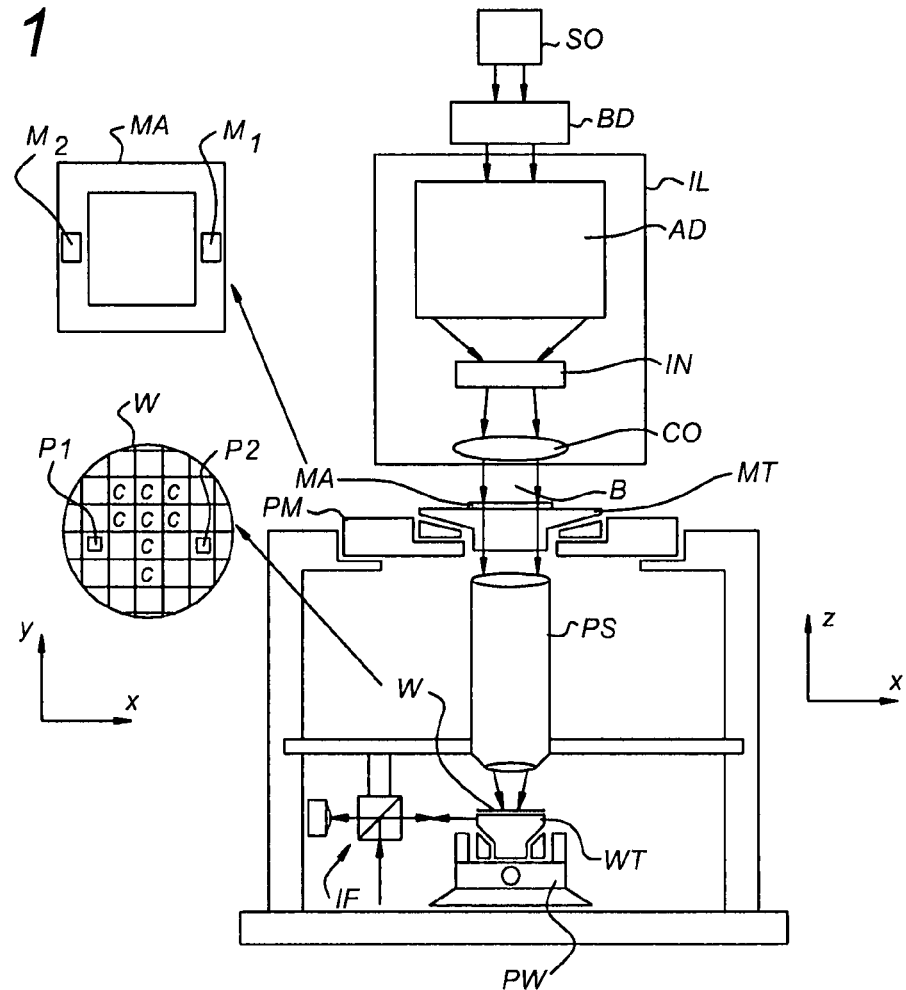
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation)

a support structure (e.g. a mask table) MT constructed to support a patterning device (e.g. a mask) MA and connected to a first positioner PM configured to accurately position the patterning device MA in accordance with certain parameters a substrate table (e.g. a wafer table) WT constructed to hold a substrate (e.g. a resist-coated wafer) W and connected to a second positioner PW configured to accurately position the substrate W in accordance with certain parameters, and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the mask and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam B from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD comprising, for example, suitable directing mirrors and/or a beam expander. In other cases, the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1,P2 as illustrated occupy dedicated target portions, they may be located in spaces between target portions (these are known as scribe-lane alignment marks). Similarly, in situations in which more than one die is provided on the mask MA, the mask alignment marks M1,M2 may be located between the dies.

The depicted apparatus could be used in at least one of the following modes:

1. In step mode, the mask table MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam B is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The present invention can be embodied in a measurement system in such a way that alignment of a substrate can be performed with respect to a substrate table with a higher accuracy than might otherwise be possible using state-of-the-art systems.

Figure 2:
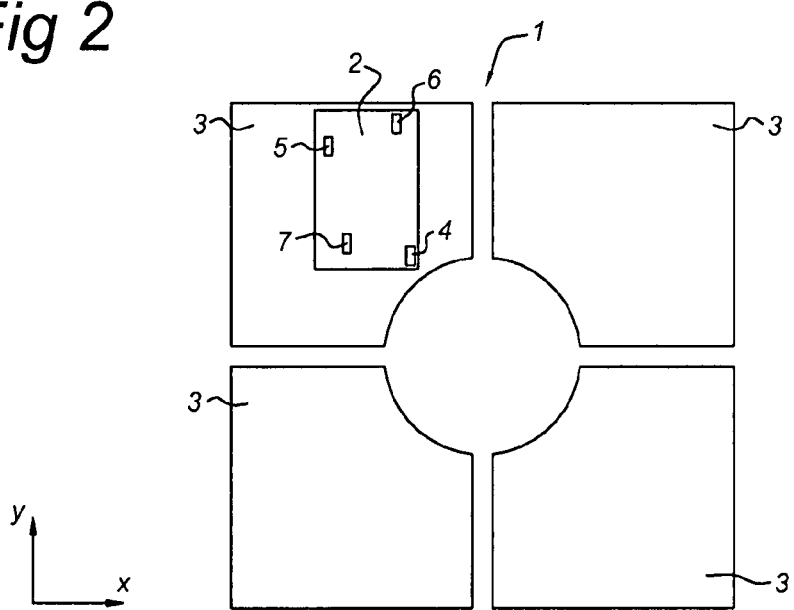
FIG. 2 schematically depicts a prior art displacement measuring system.

FIG. 2 schematically depicts a displacement measuring system 1 designed to accurately measure a position of a substrate table 2 in three coplanar degrees of freedom, e.g. a position in a first direction, i.e. the x-position, a position in a second direction, i.e. the y-position, and a position related to rotation about an axis perpendicular to both first and second directions, i.e. the rotation about the z-axis Rz, the z-axis being the axis perpendicular to the x and y axes shown in FIG. 2.

In the shown embodiment, the displacement measuring system 1 comprises four adjacent grid plates 3 which are mounted on the lithographic apparatus. Each grid plate 3 is provided with a grid with a resolution that is high enough to obtain the accuracy needed. In the shown embodiment, four grid plates 3 are used as the physical dimensions of the grid plates 3 are limited. However, it must be understood that also other arrangements comprising a different number or shape of grid plates may be used. For example, although expensive to produce, a single grid plate of the size of the working area may be used.

The grid plates 3 may be mounted on a separate frame, i.e. a so-called metrology frame, or on a lens which is part of the projection system PS. The grid plates 3 are substantially flat plates arranged in a plane which extends in the first and second directions, i.e. in the x-direction and y-direction. The grid plates 3 are positioned in such a way that at least one side of each grid plate 3 is adjacent to a side of another grid plate 3. Together, the grid plates 3 substantially cover all required locations of the substrate table 2, such that the measuring system 1 is continuously capable of measuring the position of the substrate table 2.

In the shown embodiment, the substrate table 2 is arranged underneath the grid plates 3. On the substrate table 2, two x-sensors 4, 5, and two y-sensors 6, 7 are arranged. The sensors 4, 5, 6, 7 are arranged to measure the position of the substrate table 2 with respect to the grids on the respective grid plates 3. The x-sensors 4, 5 are arranged for measuring the position of the substrate table 2 in the x-direction. The y-sensors 6, 7 are arranged for measuring the position of the substrate table 2 in the y-direction. Information obtained from one pair of the two x-sensors 4, 5 and two y-sensors 6, 7 (x, x; x, y; y, x or y,y) may be used to determine the rotation about the z-axis, i.e. the rotation in the x-y plane. With three of the two x-sensors 4, 5 and two y-sensors 6, 7 it is possible to continuously determine the position of the substrate table 2 in three coplanar degrees of freedom (x, y, Rz) with high accuracy (nanometer or sub-nanometer resolution). Generally, it is desired to be able to determine the position of the substrate table 2 at all possible locations within a lithographic apparatus, where is may appear during normal use of this lithographic apparatus. These possible locations may include an exposure area, a transfer area for movement towards and away from the exposure area, an alignment and leveling area and a substrate exchanging area.

Each of the x-sensors and y-sensors may be designed as described in the US application US 2004/0263846 A1, which document is herewith incorporated by reference.

The combination of the arrangement of the four sensors 4, 5, 6, 7 and the adjacent arrangement of the four grid plates 3 enables a sensor take-over from one grid plate 3 to another grid plate 3. During a sensor take-over, i.e. when a first sensor first cooperating with a first grid plate 3 moves towards a position in which it will cooperate with a second grid plate 3, a second sensor may provide a signal to ensure a continuous measurement. Then, when the first sensor is in the range of the second grid plate 3, possibly after re-initialization, the first sensor may again provide a signal representative for the position of the substrate table 2.

As described above three of the two x-sensors 4, 5 and y-sensors 6, 7 make it possible to determine the position of the substrate table 2 in three coplanar degrees of freedom. There is thus one redundant sensor. The redundant sensor may be used in case one of the other sensors cannot be used, e.g. because it is outside the range of the grid plates 3 or a damaged area in the grid plate 3 causes the sensor on that location to be incapable of measuring.

By selectively using a set of three sensors which can each properly determine a signal representative for a position in the x-direction or y-direction, continuous control may be obtained. The selection of the respective x-sensors and y-sensors may be performed by a selection device. The selection/choice of the respective grid plate 3 depends on the position of the substrate table 2. When all four sensors 4, 5, 6, 7 can deliver a signal, the signal generated by the redundant sensor may be used for calibration purposes.

Figure 3:
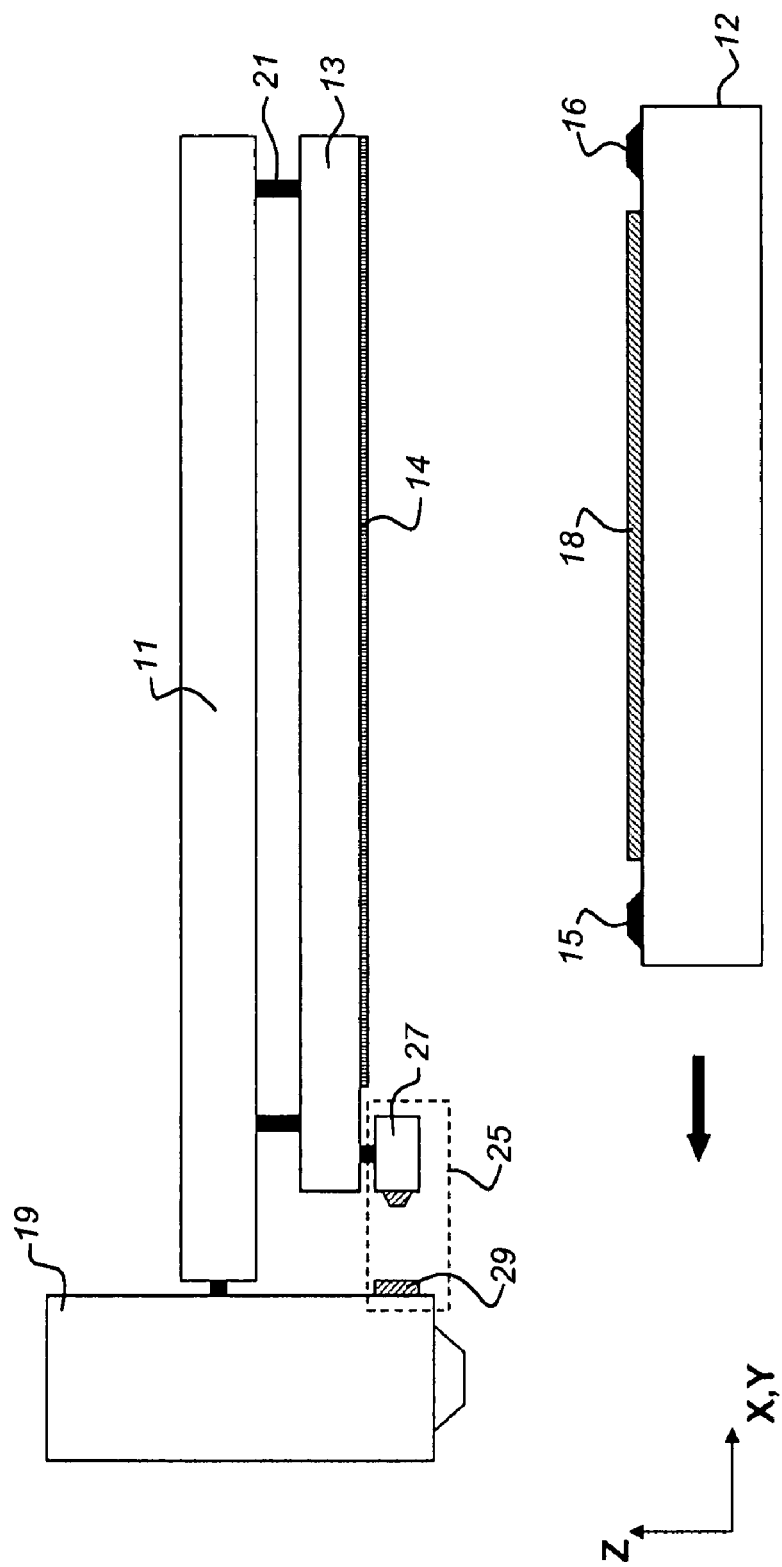
FIG. 3 schematically depicts a cross-sectional view of a part of a control system according to a first embodiment of the invention.

FIG. 3 schematically depicts a cross-sectional view of a part of a control system according to a first embodiment of the invention. In the first embodiment of the invention, the control system comprises a frame 11 supporting a first measurement system. In the first embodiment, the first measurement system comprises an alignment module or alignment system 19 arranged for measuring a position of the substrate 18 in a first coordinate system. A possible measurement result of the alignment system 19 is that the substrate 18 is in position $(a_1, b_1, c_1)$ wherein the subscripts indicate that the coordinates are in the first coordinate system.

The control system is arranged to control a substrate table 12 which is arranged to support the substrate 18. The control system controls the position of the substrate table 12 using a second measurement system (13,14,15,16). The second measurement system (13,14,15,16) measures the position of the substrate table 12 in a second coordinate system. The second measurement system (13,14,15,16) includes a grid plate 13 supported by the frame 11. The substrate table 12 is movably positioned underneath the grid plate 13. The position of the substrate table 12 is controlled by measuring the position of the substrate table 12 relative to the grid plate 13 as a function of time in a manner that will be explained hereinafter. The alignment system 19 has a presumed position $(k_2, l_2, m_2)$ in the second coordinate system. The presumed position is determined by either calibration, design or by a reference measurement and is stored in, or is otherwise made available to, the control system.

Since the substrate table 12 is under the control of the second measurement system (13,14,15,16), the position of the substrate table 12 when measuring the position of the substrate 18 is known and in this case is $(x_2, y_2, z_2)$, wherein the subscripts indicate that the coordinates are in the second coordinate system.

The control system comprises a controller (not shown) which converts the position $(a_1, b_1, c_1)$ of the substrate 18 as measured by the alignment system 19 with respect to the first coordinate system to a position of the substrate table 12 in the second coordinate system. The position of the substrate 18 in the second coordinate system is determined in dependence on the presumed position $(k_2, l_2, m_2)$ of the alignment system 19 in the second coordinate system and the measured position $(a_1, b_1, c_1)$ of the substrate 18 in the first coordinate system. The controller couples this to the position $(x_2, y_2, z_2)$ of the substrate table 12 when the substrate 18 position was measured. After this conversion, the substrate 18 can be positioned by positioning the substrate table 12.

The position of the substrate table 12 is measured relative to the grid plate 13. At the surface side of the grid plate 13 facing the substrate table 12, grids 14 are provided. On the substrate table 12, sensors 15, 16 are arranged. Sensors 15, 16 may be x-sensors or y-sensors similar to x-sensors 4, 5 or y-sensors 6, 7 discussed with reference to FIG. 2. Thus, x-sensors are arranged for measuring the position of the substrate table 12 in the x-direction, while y-sensors are arranged for measuring the position of the substrate table in the y-direction. Sensors 15, 16 are arranged for measuring the position of the substrate table 12 with respect to the grids 14 on the grid plate 13.

The control system further comprises a position error sensor 25 which is a displacement measurement module. The position error sensor 25 is arranged for determining a relative position between the alignment system 19 and the grid plate 13 as a function of time. The position error sensor 25 in the exemplary embodiment comprises two parts, a first sensor part 27 and a second sensor part 29, as depicted in FIG. 3. In an exemplary embodiment, the two sensor parts 27, 29 represent a detection signal generating and receiving unit and a reflective element, respectively. The detection signal generating and receiving unit 27 is arranged to generate a detection signal in the direction of the reflective element 29, and after reflection from the reflective element 29, to detect at least a portion of the reflected detection signal. The time it takes for the detection signal to travel from the detection signal generating and receiving unit 27 toward the reflective element 29 and back constitutes a measure of the relative position between the two. The detection signal generating and receiving unit 27 is coupled to the gridplate 13 and therefore moves with the gridplate 13. The reflective element 29 is coupled to the alignment system 19 and therefore moves with the alignment system 19. Therefore, the relative position between alignment system 19 and grid plate 13 can be measured with the position error sensor 25.

Alternatively, the first sensor part 27 and second sensor part 29 of position error sensor 25 may represent a detection signal source and detection signal detector, respectively. The detection signal source, for example, can be connected to the grid plate 13 and arranged to provide a detection signal in the direction of the detection signal detector. The detection signal detector can be connected to the alignment system 19 and arranged to detect at least a portion of the detection signal generated by the detection signal source. If the position of the detection signal source with respect to the grid plate 13 and the position of the detection signal detector with respect to the alignment system 19 are known, the time it takes for the detection signal to travel from the detection signal source towards the detection signal detector is a measure of the relative position between alignment system 19 and grid plate 13.

As will be understood by a skilled person, in embodiments of the invention types of sensors may be used that are different from the embodiments of sensor 25 described above. Alternatively, the position error sensor 25 may be a capacitive sensor comprising two parts 27 and 29, or an encoder type sensor comprising two parts 27 and 29.

The sensor 25 may be arranged for communication with a controller (not shown). The controller may comprise a processor arranged to calculate the relative position between alignment system 19 and grid plate 13 over time.

As will be understood by a skilled person, even though the control system is described by referring to a grid plate 13 having grids 14 in an x-direction and y-direction, i.e. a two-dimensional grid, it is also possible to provide the control system with a structure comprising a grid 14 in a single direction. In that case, the control system is arranged to monitor a position in one dimension.

Figure 4:
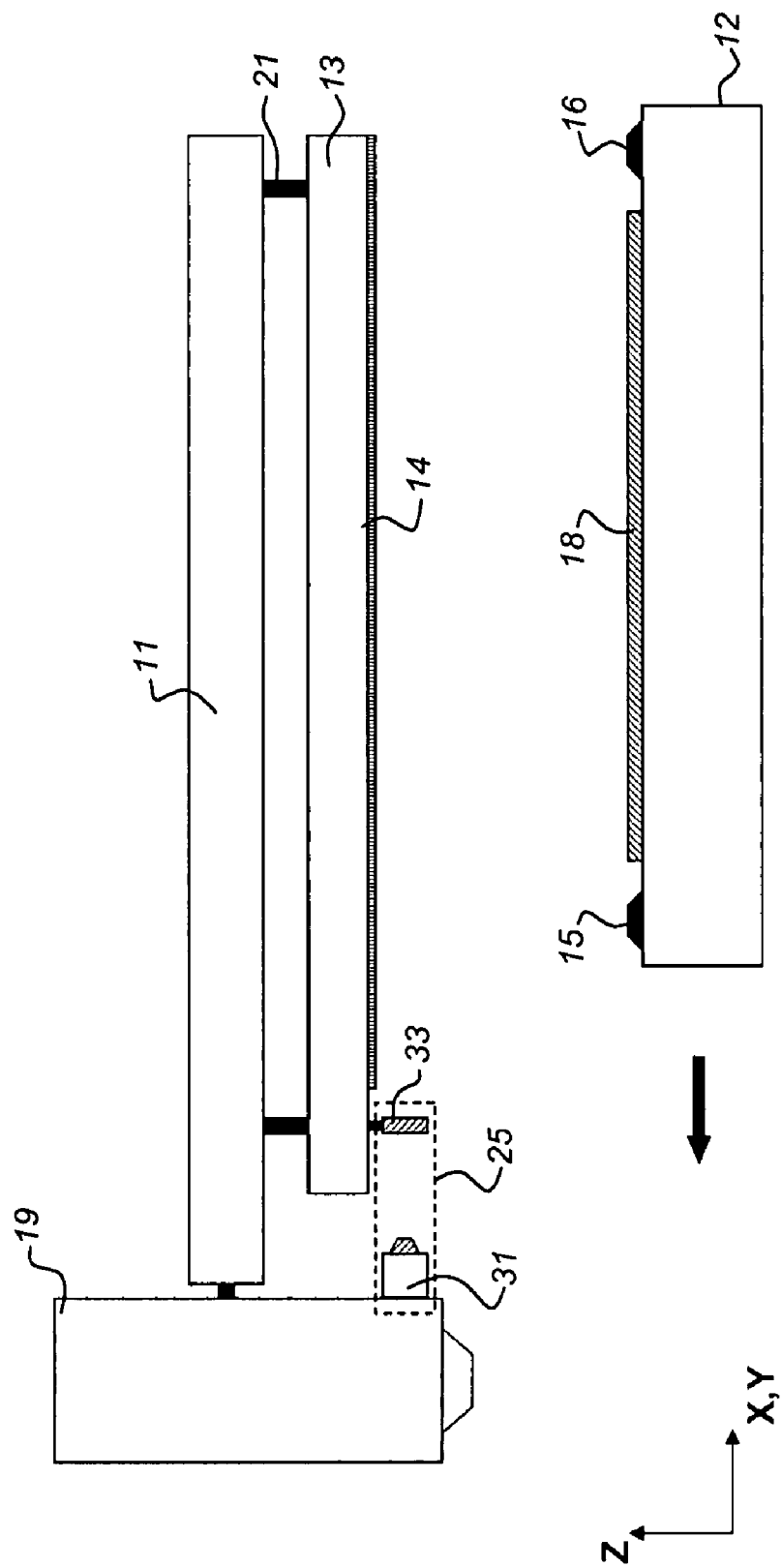
FIG. 4 schematically depicts a cross-sectional view of a part of a control system according to a second embodiment of the invention.

FIG. 4 schematically depicts a cross-sectional view of a part of a control system according to a second embodiment of the invention. In this embodiment of the control system, a first sensor part 31 (shown in FIG. 3 as sensor part 27) of the position error sensor 25 is connected to the alignment system 19 and a second sensor part 33 (shown in FIG. 3 as sensor part 29) of the sensor 25 is connected to the grid plate 13. The position error sensor 25 in this embodiment operates in a similar way as embodiments of the position error sensor 25 of the first embodiment depicted in and described with reference to FIG. 3.

Figure 5:
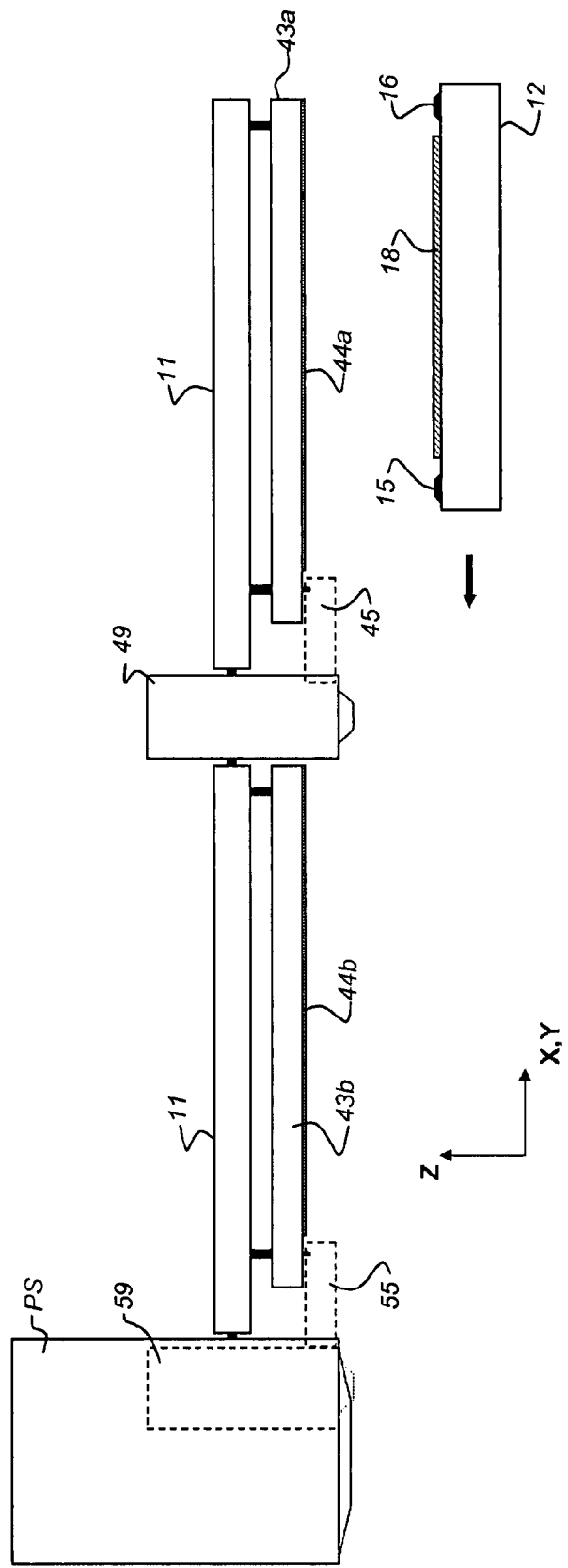
FIG. 5 schematically depicts a cross-sectional view of a part of a control system according to an embodiment of the invention.

FIG. 5 schematically depicts a cross-sectional view of a part of a control system according to a further embodiment of the invention. The control system comprises two subsystems—a first subsystem and a second subsystem. The first subsystem, e.g. the subsystem of the second embodiment, schematically depicted in FIG. 4, comprises a grid plate 43*a* and a first alignment system 49. Both the first alignment system 49 and grid plate 43*a* are connected with a frame 11. The first subsystem is arranged to determine a position of a substrate 18 located on a substrate table 12, which is arranged for moving underneath the grid plate 43*a*. At the surface side of the grid plate 43*a* facing the substrate table 12, grids 44*a* are provided. Similarly, as described hereinbefore, the substrate table 12 may be provided with sensors 15, 16 arranged for measuring the position of the substrate table 12 with respect to the grids 44*a* on the grid plate 43*a*.

The first subsystem further comprises a first position error sensor 45, e.g. the position error sensor 25 schematically depicted in FIG. 4. The first position error sensor 45 is arranged to determine a relative position between the first alignment system 49 and the grid plate 43*a* as a function of time. The first position error sensor 45 may comprise two parts, e.g. similar to the first sensor part 27, 31 and second sensor part 29, 33 as described hereinbefore with respect to FIGS. 3 and 4, respectively.

The second subsystem, also referred to as further subsystem, comprises a grid plate 43*b* and a second alignment system 59, generally like in the embodiment schematically depicted in FIG. 5 arranged in conjunction with projection system PS. Both the alignment system 59 and grid plate 43*b* are connected with the frame 11. The second subsystem is also arranged to determine a position of a substrate 18 located on a substrate table 12, however, in this case with respect to movement underneath the grid plate 43*b*. Grid plate 43*b* may, just like grid plate 43*a*, be provided with grids 44*b* such that the position of the substrate table 12 with respect to the grids 44*b* on the grid plate 43*b* may be determined by means of sensors 15, 16 provided on the substrate table 12.

The second subsystem further comprises a second position error sensor 55. The second position error sensor 55 is arranged to determine a relative position between the alignment system 59 and the grid plate 43*b*, and in this embodiment thus also determine a relative position between the projection system PS and the grid plate 43*b*, as a function of time. The second position error sensor 55 may also comprise two parts, e.g. similar to the first sensor part 27, 31 and second sensor part 29, 33 as described earlier with respect to the first and second embodiments and depicted in FIGS. 3 and 4 respectively.

In an embodiment of the measurement arrangement, the first position error sensor 45 is a sensor similar to the position error sensor 25 depicted in FIG. 3, i.e. its first sensor part is connected to the grid structure, e.g. grid plate 43*b*. In this embodiment, the second position error sensor 55, on the other hand, is a sensor similar to the position error sensor 25 depicted in FIG. 4, i.e. the first sensor part of the sensor is connected to the projection system PS.

The first position error sensor 45 may be arranged for communication with the second position error sensor 55, e.g. via a controller (not shown). Further details with respect to the form and content of aforementioned communication will be explained with reference to FIG. 6.

As will be understood by a skilled person, even though the first and second measurement assemblies are described by referring to grid plates 43*a*, 43*b* having grids 44*a*, 44*b* respectively, it is also possible that both measurement assemblies comprise structures provided with a single grid in a single direction. In that case, the measurement arrangement is arranged to monitor a position in one dimension.

It must be understood that the reference to the X,Y-direction in FIGS. 3-5 is meant to portray that in embodiments of the invention, the substrate table 12 may be moved in a first direction, e.g. the X-direction, in order to obtain an alignment position of the substrate 18 provided on the substrate table 12 with one of the alignment systems 19, 49, 59 in the X-direction, while the X-position of the substrate table 12 is monitored with respect to one of the grid plates 13, 43*a*, 43*b* by means of sensors 15, 16, being first encoder type sensors, i.e. x-sensors, in this case. Similarly, the substrate table 12 may be moved in a second direction, e.g. a Y-direction, in order to obtain an alignment position of the substrate 18 provided on the substrate table 12 with one of the alignment systems 19, 49, 59 in a Y-direction, while the Y-position of the substrate table 12 is monitored with respect to one of the grid plates 13, 43*a*, 43*b* by means of sensors 15, 16, being second encoder-type sensors, i.e. y-sensors, in this case. The X-direction may be orthogonal to the Y-direction.

Similarly, position error sensors 25, 45, 55 may comprise two sensor elements, i.e. a sensor element arranged for measuring a relative position between the respective alignment system 19, 49, 59 and the respective grid plate 13, 43*a*, 43*b* as a function of time in a first direction, e.g. the X-direction, and a sensor element arranged for measuring a relative position between the respective alignment system 19, 49, 59 and the respective grid plate 13, 43*a*, 43*b* as a function of time in a second direction, e.g. the Y-direction. Each sensor element may then comprise a first sensor part and a second sensor part as described hereinbefore.

As mentioned hereinbefore, in embodiments of the invention, only measurements in a single direction, e.g. only the X-direction or only the Y-direction, are measured. In such a case, sensors 25, 45, 55 may be arranged for a measurement in a single direction only.

With the continual desire to image ever smaller patterns to create devices with higher component densities, while keeping the number of patterns manufactured per unit time the same, or even increase that number, numerous tasks within a lithographic apparatus need to be performed faster. Consequently, accelerations and decelerations of a substrate table 12 increase as well, which may lead to grid plate vibrations. Typically, the vibrations of the grid plate(s) 13, 43*a*, 43*b* is between 100-300 Hz, in particular between 160-180 Hz for horizontal vibrations, i.e. vibrations in plane with the surface of the structure provided with at least one grid 14,44*a*,44*b*, e.g. a grid plate 13, 43*a*, 43*b*, and between 250-300 Hz for vertical vibrations, i.e. vibrations perpendicular to the surface of the structure provided with at least one grid 13, 43*a*, 43*b*, e.g. a grid plate 13, 43*a*, 43*b*.

In alternative embodiments, the position error sensor 25 measures the position of the grid plate 13 and thereby of the grid 14 relative to the frame 11. The position of the first alignment system 19 relative to the frame 11 is presumed fixed. In this embodiment, the position error sensor 25 measures the only varying component in the relative distance between the first measurement system (including, for example, alignment system 19) and the second measurement system (including, for example, grid plate 13 and grid 14). Alternatively, the position of the first measurement system (including alignment system 19) relative to the frame 11 can be measured by the position error sensor 25 and the position of the grid plate 13 and thereby of the grid 14 relative to the frame 11 is presumed fixed.

Figure 6:
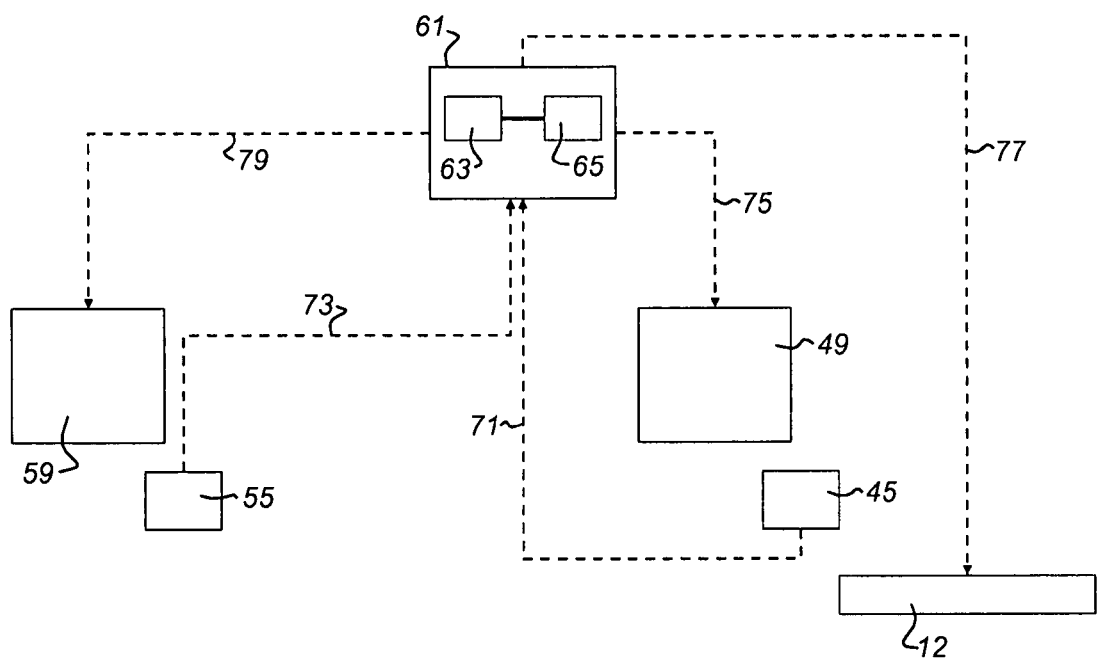
FIG. 6 schematically depicts a flow diagram of a method of controlling a support structure according to an embodiment of the invention.

FIG. 6 schematically depicts a flow diagram of a method for improving position control using a control system of the further embodiment as schematically depicted in FIG. 5. One or more elements of the control system are enabled to communicate with a controller 61. The controller 61 may comprise a processor 63 and a memory 65. More details with respect to possible embodiments of processor 63 and memory 65 will be discussed with reference to FIG. 7 using labels from previous figures.

The controller 61 is arranged to modify certain control parameters based on one or more measurements performed by a position error sensor, e.g., a first position error sensor 45 and second position error sensor 55.

In case first position error sensor 45 is used, measurement data related to the relative position as a function of time between the first alignment system 49 and grid plate 43*a* is transferred to controller 61 in action 71. Similarly, in case second position error sensor 55 is used, measurement data related to the relative position as a function of time between second alignment system 59 and grid plate 43*b* is transferred to controller 61 in action 73. The controller 61 may use the measurement data from the one or more position error sensors 45, 55, in different ways which will be described hereafter. The different ways in which the controller 61 may use the position error signal may be combined in various ways that are readily apparent upon a review of the instant disclosure.

In an embodiment, the controller 61 uses measurements by the position error sensor 25 used to dampen relative movements between the first measurement system (which, for example, includes an alignment system 19,49) and the second measurement system (which, for example, includes a grid plate 13,43*a*,43*b*). As explained earlier the first measurement system (which, for example, includes an alignment system 19,49) has a presumed position in the second coordinate system which is coupled to the second measurement system (which, for example, includes grid plate 13,43*a*,43*b*). In this embodiment, the position error signal from the position error sensor 25 is fed to an actuator (not shown) to drive either the first measurement system (including, for example, alignment system 19,49) and/or the second measurement system (including, for example, grid plate 13,43*a*,43*b*) to the presumed relative positions. This method can be applied when the relative positions of the first measurement system and the second measurement system are measured directly, and also when one of the first measurement system and the second measurement system is presumed fixed and the position of the other measurement system relative to the frame is measured. Thus, the actuator dampens the relative movements of the first measurement system and the second measurement system.

In an embodiment, the control system is arranged to receive target relative positions of the first measurement system (which, for example, includes the alignment system 19,49) and the substrate table 12 in the second coordinate system. The intent is to measure the position of the substrate 18 while the first measurement system and the substrate table 12 are in their target relative position. Thereby, account is given for the presumed position of the first measurement system in the second coordinate system. Since the target relative positions are in the second coordinate system and the actual position of the first measurement system (which, for example, includes the alignment system 19,49) varies around its presumed position, the actual measurement by the first measurement system comprises an error. In this embodiment, the controller 61 uses the signal from the position error sensor 25 to control the position of the support structure in dependence on the position error signal and the target relative positions when measuring the position of the substrate 18 with the first measurement system. More specifically, the controller 61 adjusts the position of the support structure 12 to compensate for the deviation between the actual and the presumed position of the first measurement system in the second coordinate system. Alternatively, the position of the first measurement system is controlled to compensate, for instance by a dampening system, for the deviation between the actual and the presumed position of the first measurement system. It is not important which measurement system is vibrating or if both measurement systems are vibrating; the relative positions of the coordinate systems coupled to the respective measurement systems are controlled.

In an embodiment, the controller 61 is arranged to convert the position of the substrate 18 in the first coordinate system to a converted position of the substrate table 12 in the second coordinate system using:

the position of the substrate measured by the first measurement system (which, for example, includes the alignment system 19,49)

the presumed position of the first measurement system in the second coordinate system the position of the support structure (e.g, substrate table 12) in the second coordinate system and is also arranged to correct the converted position in dependence on the position error signal. This is explained hereinbefore in relation to the exemplary embodiment shown in FIG. 3.

Alternatively, the converted position is not corrected afterwards as in the first embodiment described using FIG. 3. Instead, the actual position of the first measurement system (which, for example, includes the alignment system 19,49) in the second coordinate system (which is coupled to the second measurement system that can include, for example, the grid plate 13,43a) is used to convert the position of the substrate 18 to a converted position of the substrate table 12 in the second coordinate system. The actual position of the first measurement system in the second coordinate system is obtained by correcting the presumed position with the position error signal from the position error sensor 25.

The different ways in which the controller 61 may use the position error signal, in practice, may be followed by positioning the substrate table 12 for illuminating the substrate 18 with an image formed by a patterned beam of radiation B. By using the converted position, the substrate 18 is positioned with respect to the pattern in the beam B so that a good overlay can be obtained. Alternatively or additionally, the first measurement system comprises a level sensor for measuring the position of a surface of the substrate 18 facing away from the substrate table 12 and the control system is capable of bringing the surface precisely into focus, i.e., at a position in the patterned beam B where a sharp image is formed.

In the previous embodiments, sampling moments of different sensors, e.g. sensors 45, 55, and alignment systems 49, 59 may need to be adapted, i.e. synchronized or calculated, in embodiments of the measurement arrangement according to the invention.

Figure 7:
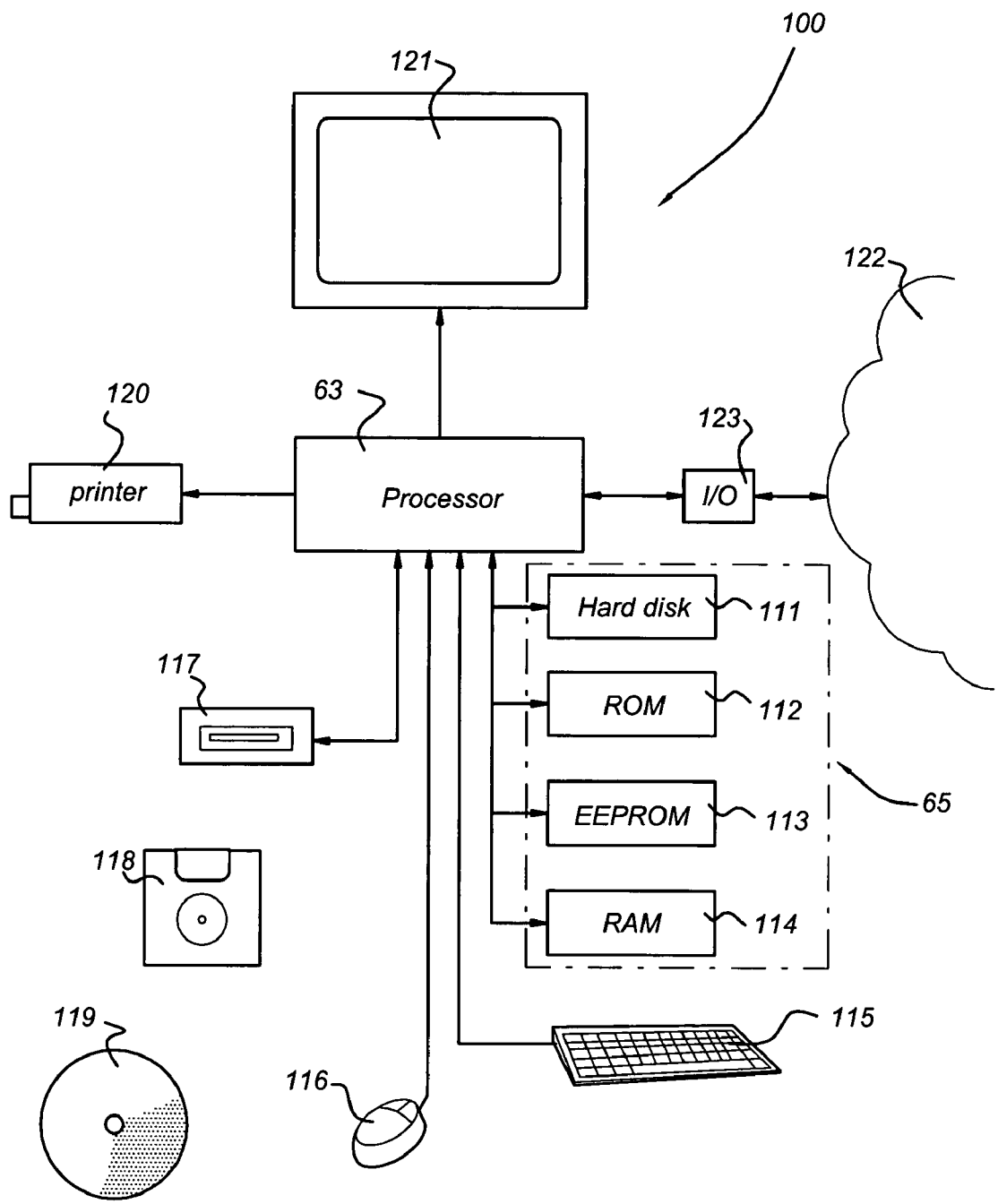
FIG. 7 schematically depicts an embodiment of a computer assembly that may be used by a control system according to an embodiment of the present invention.

It should be understood that the processor 63 of controller 61 as used throughout this text can be implemented in a computer assembly 100 as shown in FIG. 7. The computer assembly 100 may be a dedicated computer in the form of the controller 61 in embodiments of the assembly according to the invention or, alternatively, be a central computer controlling the lithographic projection apparatus. The memory 65 connected to the processor 63 may comprise a number of memory components, such as a hard disk 111, a Read Only Memory (ROM) 112, an Electrically Erasable Programmable Read Only Memory (EEPROM) 113 and a Random Access Memory (RAM) 114. Not all aforementioned memory components need to be present. Furthermore, it is not essential that the aforementioned memory components are physically located in close proximity to the processor 63 or to each other. They may be located at a distance away The processor 63 may also be connected to some kind of user interface, for instance, a keyboard 115 or a mouse 116. A touch screen, track ball, speech converter or other interfaces that are known to persons skilled in the art may also be used.

The processor 63 may be connected to a reading unit 117, which is arranged to read data from and, under some circumstances, store data on a data carrier, like a floppy disc 118 or a CDROM 119. Also DVD's or other data carriers known to persons skilled in the art may be used.

The processor 63 may also be connected to a printer 120 to print out output data on paper as well as to a display 121, for instance a monitor or LCD (Liquid Crystal Display), or any other type of display known to a person skilled in the art.

The processor 63 may be connected to a communications network 122, for instance a public switched telephone network (PSTN), a local area network (LAN), a wide area network (WAN) etc. by means of transmitters/receivers 123 responsible for input/output (I/O). The processor 63 may be arranged to communicate with other communication systems via the communications network 122. In an embodiment of the invention, external computers (not shown), for instance personal computers of operators, can log into the processor 63 via the communications network 122.

The processor 63 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 63 may even be located a distance away from the other processing units and communicate via the communications network 122.

In embodiments of the invention, the measurement precision of the position error sensor 25, the first position error sensor 45 or the second position error sensor 55 is enhanced by reducing dependence on temperature. This, for instance, can be done by mounting the first sensor part 27 of position error sensor 25 on a member with a low thermal expansion coefficient, for instance with a value below $0.1 \times 10^{-6} K^{-1}$ or below $2 \times 10^{-8} K^{-1}$. The member is for instance made of Zerodur™ glass ceramic (manufactured by Schott Glas, Hattenbergstraße 10 55120, Mainz, Germany). The function of the member is to reduce the distance between the first sensor part 27 and the second sensor part 29 and to provide a position for the first sensor part 27 that does not depend on temperature.

In an embodiment, the first sensor part 27 comprises a laser and a detector and the second sensor part 29 comprises a mirror, and the detection signal travels through a gas between the first sensor part 27 and the second sensor part 29. Together the first sensor part 27 and the second sensor part 29 are operated as an interferometer measuring a parameter that depends on the time for the detection signal to travel from the first sensor part 27 to the second sensor part 29 and back as explained hereinbefore. This time depends on the optical index of refraction, which in turn depends on the temperature of the gas. The larger the distance between the first sensor part 27 and the second sensor part 29, the larger the absolute influence of temperature on the time. Reducing the distance, reduces the influence of temperature on the absolute time. It will be appreciated that although the member may still experience expansion and thereby influence the path length between the first sensor part 27 and the second sensor part 29 (since the first sensor part 27 is mounted on the member), this influence is much smaller than the influence temperature may have on the time by making the member of a material with a suitably low thermal expansion coefficient.

It will also be appreciated that other embodiments are possible as well, such as having a further member for mounting the second sensor part 29, having only a member for the second sensor part 29 and not for the first sensor part 27. Also, the position error sensor 25 should be able to determine displacements of the first sensor part 27 and the second sensor part 29 and thus may comprise an optical encoder system or may comprise in general a detection signal source as a first or second sensor part 27,29 and a detection signal detector as the other sensor part as explained hereinbefore. Also, the position error sensor 25 may have a third sensor part (not shown) which measures the distance between the member and the further member, both comprising a material with a low thermal expansion coefficient, wherein the third sensor part is located away from the member and the further member, for instance, by being mounted on the frame 11 or even on another part of the lithographic apparatus or a further frame.

Although specific reference may be made in this text to the use of lithographic apparatus in the manufacture of ICs, the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It will be appreciated that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control system for controlling a support structure in a lithographic apparatus, said control system comprising:
    a first measurement system arranged to measure, in a first coordinate system, a position of an object supported by the support structure;
    a second measurement system configured to measure a position of the support structure in a second coordinate system, the first measurement system having a presumed position in the second coordinate system; and
    a controller configured to:
        control the position of the support structure based on measurements by the second measurement system,
        convert the measured position of the object into a converted position of the support structure in the second coordinate system, and
        position the support structure based on the converted position;
    wherein the controller is further configured to receive a position error signal indicative of a difference between the presumed position and an actual position of the first measurement system in the second coordinate system, and to position the support structure in a manner dependent upon the position error signal, and
    wherein the controller is further configured to determine the actual position of the first measurement system in the second coordinate system using the presumed position and the position error signal, and is configured to determine the converted position in a manner dependent upon the actual position of the first measurement system and the measured position of the object.

2. A control system according to claim 1, wherein the second measurement system comprises a reference structure to which the second coordinate system is coupled.

3. A control system according to claim 2, wherein the controller is arranged to dampen the position error signal by using the position error signal to control the relative positions of the first measurement system and the reference structure.

4. A control system according to claim 1, wherein the controller is configured to receive target relative positions of the first measurement system and the support structure and is configured to control the position of the support structure in a manner dependent upon the position error signal and the target relative positions when measuring the position of the object using the first measurement system.

5. A control system according to claim 1, wherein the controller is configured to convert the position of the object in the first coordinate system to a converted position of the support structure in the second coordinate system based on:
    the position of the object measured by the first measurement system,
    the presumed position of the first measurement system in the second coordinate system, and the position of the support structure in the second coordinate system, and wherein the controller is further configured to correct the converted position in a manner dependent upon the position error signal.

6. A control system according to claim 2, wherein the first measurement system and the reference structure are supported by a frame.

7. A control system according to claim 1, further comprising a position error sensor arranged to measure a distance between a first sensor part and a second sensor part.

8. A control system according to claim 7, wherein the first sensor part is connected to at least one of the first measurement system and the second measurement system.

9. A control system according to claim 8, wherein the second sensor part is connected to one of the first measurement system and the second measurement system so that the distance between the first measurement system and the second measurement system can be measured directly.

10. A control system according to claim 7, wherein the second sensor part is connected to the frame.

11. A control system according to claim 3, wherein the controller comprises a dampening system to dampen variations of the distance measured by the position error signal.

12. A control system according to claim 7, wherein at least one of the first sensor part and the second sensor part comprises a material with a thermal expansion coefficient smaller than $0.1 \times 10^{-6} \, k^{-1}$.

13. A control system according to claim 7, wherein at least one of the first sensor part and the second sensor part comprises a material with a thermal expansion coefficient smaller than $2 \times 10^{-8} \, K^{-1}$.

14. A control system according to claim 7, wherein the position error sensor comprises an interferometer.

15. A control system according claim 7, wherein the position error sensor comprises an encoder system.

16. A control system according to claim 1, wherein the position error signal is indicative of a difference between the presumed position and an actual position of the first measurement system in the second coordinate system in at least two dimensions.

17. A control system according to claim 1, wherein the first measurement system comprises an alignment sensor.

18. A control system according to claim 1, wherein the first measurement system comprises a level sensor.

19. A control system according to claim 1, wherein the second measurement system comprises an encoder type sensor.

20. A control system according to claim 2, wherein the reference structure comprises a grid plate.

21. A lithographic projection apparatus comprising the control system of claim 1.

22. A lithographic projection apparatus according to claim 21, further comprising a projection system, and wherein the controller is further configured to:
   receive a further position error signal indicative of a difference between a presumed and an actual projection system position in the second coordinate system, and
   position the support structure in a manner dependent upon the further position error signal.

23. A method of controlling a support structure in a lithographic apparatus comprising:

providing an object to a support structure arranged to support the object;

measuring a position of the object in a first coordinate system using a first measurement system;

measuring a position of the support structure in a second coordinate system, the first measurement system having a presumed position in the second coordinate system;

converting the measured position of the object into a converted position of the support structure in the second coordinate system;

performing a first positioning of the support structure in a manner dependent upon the measured position of the support structure, the converted position of the support structure, and a position error signal indicative of a difference between the presumed position and an actual position of the first measurement system in the second coordinate system;

determining the actual position of the first measurement system in the second coordinate system using the presumed position and the position error signal; and determining the converted position in a manner dependent upon the actual position of the first measurement system and the measured position of the object.

24. The method of claim 23, wherein the first positioning is performed in a manner that also depends upon a position of an image plane of a projection system in the second coordinate system.

25. A computer program product embodied in a non-transitory machine-readable medium, said computer program product being encoded with instructions for performing, when executed by a processor, a method of controlling a support structure in a lithographic apparatus, said method comprising:

providing an object to a support structure arranged to support the object, measuring a position of the object in a first coordinate system with a first measurement system, measuring a position of the support structure in a second coordinate system, the first measurement system having a presumed position in the second coordinate system, converting the measured position of the object into a converted position of the support structure in the second coordinate system, performing a first positioning of the support structure in a manner dependent upon the measured position of the support structure, the converted position of the support structure, and a position error signal indicative of a difference between the presumed position and an actual position of the first measurement system in the second coordinate system.;

determining the actual position of the first measurement system in the second coordinate system using the presumed position and the position error signal; and determining the converted position in a manner dependent upon the actual position of the first measurement system and the measured position of the object.

26. The computer program product of claim 25, wherein the instructions are encoded such that, when executed by a processor, the first positioning is performed in a manner that is further dependent upon a position of an image plane of a projection system in the second coordinate system.

* * * * *

UNITED STATES PATENT AND TRADEMARK OFFICE
CERTIFICATE OF CORRECTION

PATENT NO.         : 7,804,579 B2                                       Page 1 of 1
APPLICATION NO.    : 11/812817
DATED              : September 28, 2010
INVENTOR(S)        : Loopstra et al.

It is certified that error appears in the above-identified patent and that said Letters Patent is hereby corrected as shown below:

Title page, (75) Inventors section, please delete "Antonlus" and replace with "Antonius"

Claim 25, Column 18, line 50, please delete "." after the word "system"

Signed and Sealed this

Thirtieth Day of November, 2010

David J. Kappos
*Director of the United States Patent and Trademark Office*